United States Patent
Hembree

(10) Patent No.: US 7,745,942 B2
(45) Date of Patent: Jun. 29, 2010

(54) DIE PACKAGE AND PROBE CARD STRUCTURES AND FABRICATION METHODS

(75) Inventor: David R. Hembree, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 881 days.

(21) Appl. No.: 11/472,010

(22) Filed: Jun. 21, 2006

(65) Prior Publication Data

US 2007/0296090 A1 Dec. 27, 2007

(51) Int. Cl.
*H01L 23/52* (2006.01)

(52) U.S. Cl. .................. 257/784; 257/780; 257/734; 438/617

(58) Field of Classification Search ......... 257/784–780, 257/734–736; 438/617
See application file for complete search history.

(56) References Cited

U.S. PATENT DOCUMENTS 6,208,546 B1 * 3/2001 Ikeda .......................... 365/51
6,372,552 B1 * 4/2002 Kinsman et al. ............. 438/124

OTHER PUBLICATIONS

Bober, Barbara, et al., Current Trends in Flip-Chip Bonding Technique for Multichip Modules-Especially Micro-Jet Printing, IMAPS Poland Conference 2000, http://www.cyf-kr.edu.pl/academic/OBRMHiR/imaps/data/txt/txt04.htm, printed Jan. 10, 2005, 14 pages.

* cited by examiner

*Primary Examiner*—Thinh T Nguyen
(74) *Attorney, Agent, or Firm*—TraskBritt

(57) ABSTRACT

A semiconductor die has conductors encapsulated in a dielectric material disposed on the active surface extending across the active surface from bond pads to one or more peripheral edges where the conductor ends are disposed at a side surface of the dielectric material. Stacks of such semiconductor dice, wherein one of the dice is configured with discrete conductive elements projecting from the active surface, and the exposed ends of the dice in the stack are connected with vertical interconnects. A probe card is disclosed having bond wires extending from one or more central contacts between one or more peripheral contacts to the edge of the probe card. A probe card having an upper layer bearing contacts and at least one window therethrough, a lower layer bearing conductive traces with ends exposed through the at least one window, and conductors extending from at least some of the contacts to conductive trace ends is also provided. Methods of making the foregoing structures are disclosed.

41 Claims, 9 Drawing Sheets

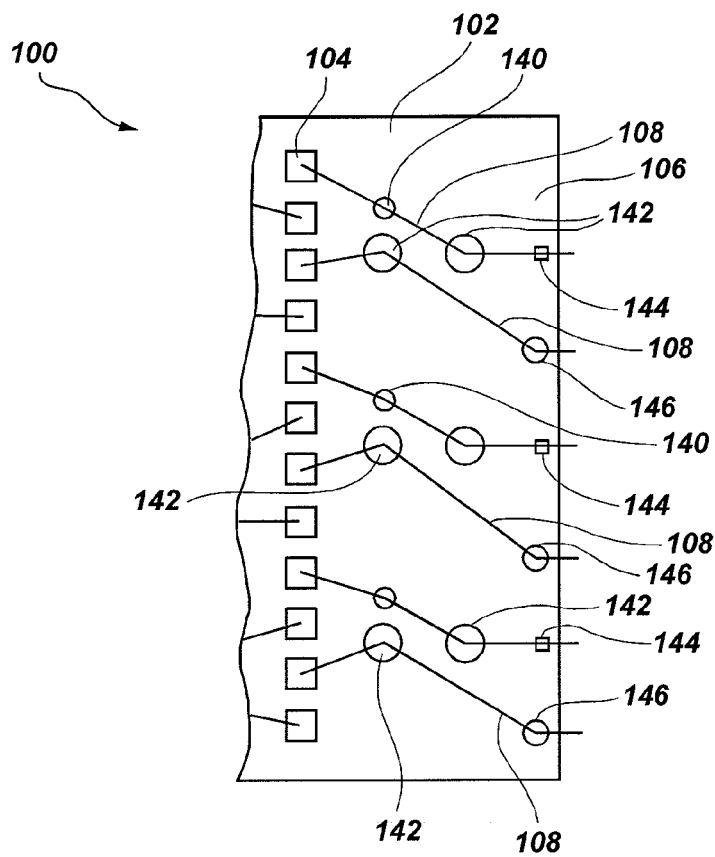
FIG. 7A
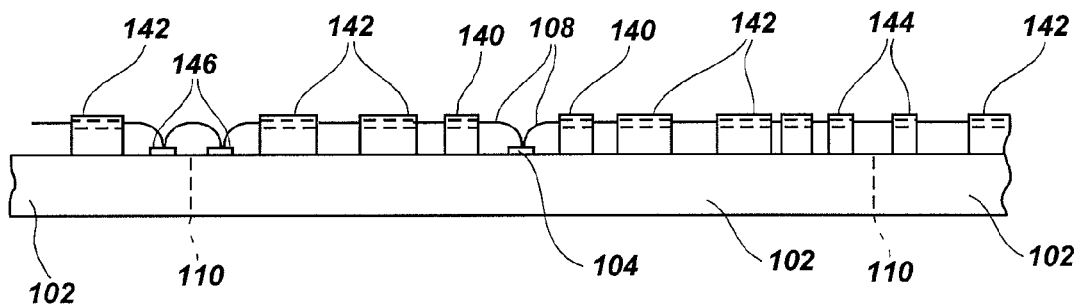
FIG. 7B
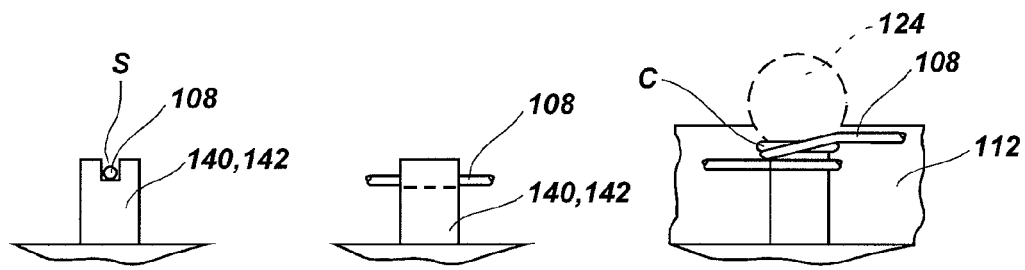
FIG. 8A   FIG. 8B   FIG. 8C

DIE PACKAGE AND PROBE CARD STRUCTURES AND FABRICATION METHODS

BACKGROUND OF THE INVENTION

1. Field of the Invention

The present invention relates generally to packaging of semiconductor devices and, more particularly, to single die and multi-die semiconductor device packages as well as to methods of fabricating such packages and subcomponents thereof. The present invention is also directed to methods of fabricating probe cards and resulting structures.

2. Discussion of Related Art

Semiconductor dice are becoming ever-smaller in dimension, both from advances in fabrication technology and as so-called "shrinks" of initial semiconductor die designs are developed to increase the number of dice which may be fabricated on a wafer or other bulk semiconductor substrate. As a consequence, it becomes more difficult to employ lead frame-based packaging techniques using, for example, wire bonds to connect bond pads of a die to lead fingers of a lead frame due to diminishing size of bond pads as well as decreasing pitch (spacing) between adjacent bond pads, rendering it difficult, if not impossible in some circumstances, to place inner ends of lead fingers of a lead frame in close proximity to bond pads to which they are to be wire bonded.

Further, when bond pads are arranged along a central axis of a semiconductor die, such as is conventional in so-called "leads over chip," or "LOC" packages, one may be faced with a choice between elongating and overcrowding lead fingers to place them in close proximity to the bond pads, or forming overly long wire bonds between the bond pads and remotely placed inner ends of lead fingers and risking potential breakage of the wire bonds or shorting between adjacent wire bonds when the package is being transfer-molded in an encapsulant by so-called "wire bond sweep" initiated by the flow front of the molten encapsulant moving over the active surface of the semiconductor die.

In addition, most conventional, lead frame-based packages do not facilitate high device density in conjunction with high multi-die device yields in terms of utilizing available "real estate" on a printed circuit board or other higher-level packaging.

Therefore, it would be desirable to provide a semiconductor device assembly packaging configuration which would accommodate ever-smaller semiconductor dice and their smaller, more closely pitched bond pads, and which would also facilitate the fabrication of highly reliable multi-die assemblies offering relatively high device densities.

It has also been recognized by those of ordinary skill in the art that it is desirable to probe test multiple semiconductor dice simultaneously, and that some dice employ bond pad configurations which render it difficult to fabricate probe cards suitable for probe testing a plurality of such dice without using a substrate including multiple layers of conductive traces. Further, in order to accommodate some bond pad configurations, it may be necessary to provide fairly long conductive paths from the location of a given interior contact to the periphery of the probe card substrate, inducing excessive capacitance, particularly if the paths comprise thin-film, planar metal traces.

Therefore, it would also be desirable to fabricate a relatively simple, yet robust, probe card using a single layer substrate which may be configured to accommodate any bond pad configuration resident on a plurality of dice to be probe tested simultaneously and minimize capacitance along the conductive paths leading from the contacts.

BRIEF DESCRIPTION OF THE DRAWINGS

FIG. 7A is a top elevation of a portion of a semiconductor die having guide posts or pins, OLB posts and guide comb elements and jumper pads disposed thereon, according to the present invention, and bond wires routed from the bond pads to the guide posts or pins, to the OLB post locations, and across a street between the die and an adjacent die (not shown), optionally being routed through a guide comb element or bonded to a jumper pad before extending across the street;

FIG. 7B is a side elevation of a portion of a semiconductor die (not necessarily the semiconductor die of FIG. 7A) having guide posts or pins, OLB posts and guide comb elements and jumper pads disposed thereon, according to the present invention, and bond wires routed from the bond pads to the guide posts or pins, to the OLB post locations, and across streets to adjacent dice, optionally being routed through a guide comb element or bonded to a jumper pad before extending across the streets;

FIGS. 8A and 8B are enlarged frontal and side elevations, respectively, of a slotted OLB post having a bond wire disposed in the slot thereof and a discrete conductive element disposed thereon, and FIG. 8C is an example of a capped OLB post having a bond wire wrapped thereabout and a discrete conductive element disposed thereon;

DETAILED DESCRIPTION OF THE ILLUSTRATED EMBODIMENTS

Figure 1:
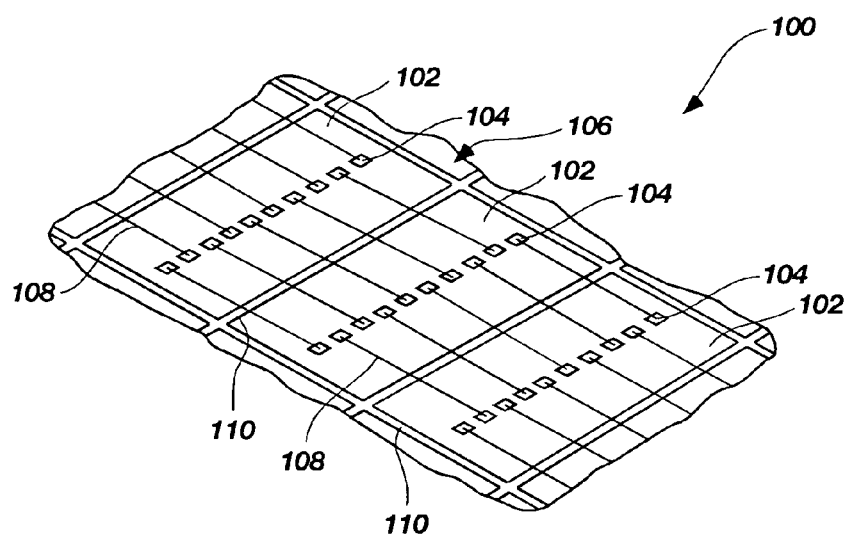
FIG. 1 is a perspective view of a portion of a semiconductor wafer, showing a plurality of mutually adjacent dice prior to singulation thereof with bond wires extending between adjacent dice and across intervening streets between the dice.

The present invention, in several embodiments, comprises single die and multi-die semiconductor device packages as well as methods of fabricating such packages and subcomponents thereof. The present invention also comprises probe cards configured for simultaneous wafer-level testing of multiple dice, and methods of fabrication thereof.

In one embodiment, the present invention comprises a method of forming individual semiconductor die assemblies which may be configured for use individually or stacked to form a multi-die package, in either case being provided with discrete conductive elements protruding transversely from a major surface thereof for use in connecting the package to higher-level packaging such as a printed circuit board.

Semiconductor dice in wafer or other bulk substrate form (each of which may be termed a "wafer" herein for the sake of convenience) may each be provided with one or more central rows of bond pads proximate a central longitudinal axis thereof, as known in the art. Bond wires are extended between bond pads of laterally adjacent dice across and transverse to the intervening "streets" between the respective die locations. An epoxy or other flowable dielectric material is then disposed over the surface of the wafer bearing the bond wires to encapsulate the bond wires, and then cured or otherwise solidified. The wafer is then singulated into individual dice by a technique known in the art, the bond wires severed and the ends thereof exposed at the surface of the dielectric material.

All of the bond wires for a given die, or all of the bond wires for the dice on a given wafer, may be provided with a loop portion extending away from the surface of the die between the bond bad and the periphery of the die, the loop portion also being encapsulated by the dielectric material. In this case, before singulation of the dice, the dielectric material is removed sufficiently to expose the loop portions, which may be configured as coils or in a serpentine shape. The exposed loop portions may then have discrete conductive elements formed thereon or attached thereto for use in connecting the die to higher-level packaging, either before or after the dice are singulated from the wafer. An anisotropic conductive film may also be used in lieu of discrete conductive elements.

If it is desired to form a single die package, the bond wires may be terminated short of the lateral boundary of the die, so as to be completely encapsulated after singulation. On the other hand, if it is desired to form a multi-die package, the bond wires may be extended across the streets as described above. In the latter instance, one or more dice are then stacked upon a die bearing discrete conductive elements, mutually adhered with the exposed bond wire ends vertically aligned and the exposed wire bond ends connected with conductive traces.

In a variation of the foregoing embodiment, and with specific reference to a die bearing discrete conductive elements, it may be desirable to form an array of such elements across the face of the die at precise locations and not necessarily along a straight path between each bond pad and a laterally adjacent street. In this variation, dielectric alignment elements may be disposed or formed on the face of the die in the form of bond wire guide pins or posts and OLB (outer lead bond) posts prior to formation of the bond wires. The guide pins or posts may be disposed between bond pad and associated OLB locations, between OLB locations and the street adjacent the die, or at both such locations. The bond wires may then be disposed over the guide posts or pins to reside in (for example) slots therein, and placed in slots or wound around the OLB posts. After encapsulation of the bond wires, the portions of the wires disposed on the OLB posts may be exposed, and discrete conductive elements formed or disposed thereon, before or after singulation. In lieu of, or in addition to, the use of guide pins or posts, the semiconductor dice may be provided with guide comb elements or electrically isolated, wire-bondable jumper pads adjacent the peripheries thereof, and the bond wires engaged with the guide comb elements or bonded to the pads before being extended across the streets to jumper pads of adjacent dice.

In another variation of the foregoing embodiment, traces are formed on a surface of the wafer between bond pads of adjacent die locations and across intervening streets. The traces may be formed with outer ends which flare or fan out, deepen, or both, before crossing the streets, so that when the dice are singulated, a larger surface is presented for establishing a vertical electrical connection between stacked dice. The traces may be disposed in trenches or channels of a patterned dielectric material disposed on the surface of the die, the trenches or channels leaving the bond pads exposed for contact with conductive material disposed therein, and being deepened as well as widened near the die periphery to enhance the exposed surface area of conductive material for electrically connecting stacked dice. Enlarged pads may be formed at intended OLB locations on the active surface. Another blanket or patterned dielectric layer may be disposed over the bond pads and traces, to provide a patterned layer having an array of openings therethrough at the OLB locations. A conductive material such as solder or gold may be placed upon the enlarged pads of conductive material exposed through each of the array of openings to form an array of discrete conductive elements on the enlarged pads.

The present invention also encompasses single and multi-die assemblies and packages fabricated in accordance with the foregoing methods and incorporating the disclosed structures, as well as intermediate structures in the form of semiconductor wafers prior to singulation.

In another embodiment, a probe card configured for simultaneously probing a plurality of semiconductor dice is formed. A plurality of contacts configured as pillars is formed at locations on a substrate to protrude from a surface thereof, the plurality of contacts being located in a plurality of groups, each contact group corresponding in pattern and pitch to the pattern and pitch of a group of bond pads on a semiconductor die of a plurality of semiconductor dice to be simultaneously probed, and being spaced from adjacent contact groups in like manner to the spacing of adjacent bond pad groups. The contact tips are formed or coated with a conductive material and are in conductive communication with relatively short conductive traces carried on the surface of the substrate. Bond wires are then extended from the ends of the conductive traces to terminals or short traces at the substrate periphery, or extended over the periphery of the substrate to terminals on a probe card carrier. In some embodiments, bond wires connected to traces associated with some contacts are routed between other contacts as they extend toward a periphery of the probe card. In such embodiments, the sides of the contacts between which the bond wires extend may be electrically insulated to eliminate shorting between a contact and a bond wire. The bond wires may be disposed in trenches etched or otherwise formed in the substrate material, may be coated with a dielectric material, or both.

It is also contemplated that a substrate sized and configured for contacting bond pads of only a single die may be fabricated in accordance with the present invention, as described in the preceding paragraph. Such a substrate has utility, for example, for testing a single die (as in testing for known good die, or KGD) by providing a temporary interconnect between the bond pads of a semiconductor die and a carrier, or as an interposer between the bond pads of the semiconductor die and external connections of a package in which the die is assembled.

In a variation of the foregoing embodiments relating to single and multi-die substrates in the form of interconnects, interposers and probe cards, a multi-layer substrate is employed wherein one or more "windows" are formed through an upper substrate layer and electrical connections extended from contacts surrounding or otherwise adjacent the windows to terminal pads of circuit traces are carried on the lower substrate layer.

Semiconductor dice in wafer or other bulk substrate form (each of which may be termed a "wafer" herein for the sake of convenience) may each be provided with one or more central rows of bond pads proximate a central longitudinal axis thereof, as known in the art. Bond wires are extended between bond pads of laterally adjacent dice across and transverse to the intervening "streets" between the respective die locations. An epoxy or other flowable dielectric material is then disposed over the surface of the wafer bearing the bond wires to encapsulate the bond wires, and then cured or otherwise solidified. The wafer is then singulated into individual dice by a technique known in the art, the bond wires severed and the ends thereof exposed at the surface of the dielectric material.

All of the bond wires for a given die, or all of the bond wires for the dice on a given wafer, may be provided with a loop portion extending away from the surface of the die between the bond pad and the periphery of the die, the loop portion also being encapsulated by the dielectric material. In this case, before singulation of the dice, the dielectric material is removed sufficiently to expose the loop portions, which may be configured as coils or in a serpentine shape. The exposed loop portions may then have discrete conductive elements formed thereon or attached thereto for use in connecting the die to higher-level packaging, either before or after the dice are singulated from the wafer. An anisotropic conductive film may also be used in lieu of discrete conductive elements.

If it is desired to form a single die package, the bond wires may be terminated short of the lateral boundary of the die, so as to be completely encapsulated after singulation. On the other hand, if it is desired to form a multi-die package, the bond wires may be extended across the streets as described above. In the latter instance, one or more dice are then stacked upon a die bearing discrete conductive elements, mutually adhered with the exposed bond wire ends vertically aligned and the exposed wire bond ends connected with conductive traces.

In a variation of the foregoing embodiment, and with specific reference to a die bearing discrete conductive elements, it may be desirable to form an array of such elements across the face of the die at precise locations and not necessarily along a straight path between each bond pad and a laterally adjacent street. In this variation, dielectric alignment elements may be disposed or formed on the face of the die in the form of bond wire guide pins or posts and OLB (outer lead bond) posts prior to formation of the bond wires. The guide pins or posts may be disposed between bond pad and associated OLB locations, between OLB locations and the street adjacent the die, or at both such locations. The bond wires may then be disposed over the guide posts or pins to reside in (for example) slots therein, and placed in slots or wound around the OLB posts. After encapsulation of the bond wires, the portions of the wires disposed on the OLB posts may be exposed, and discrete conductive elements formed or disposed thereon, before or after singulation. In lieu of, or in addition to, the use of guide pins or posts, the semiconductor dice may be provided with guide comb elements or electrically isolated, wire-bondable jumper pads adjacent the peripheries thereof, and the bond wires engaged with the guide comb elements or bonded to the pads before being extended across the streets to jumper pads of adjacent dice.

In another variation of the foregoing embodiment, traces are formed on a surface of the wafer between bond pads of adjacent die locations and across intervening streets. The traces may be formed with outer ends which flare or fan out, deepen, or both, before crossing the streets, so that when the dice are singulated, a larger surface is presented for establishing a vertical electrical connection between stacked dice. The traces may be disposed in trenches or channels of a patterned dielectric material disposed on the surface of the die, the trenches or channels leaving the bond pads exposed for contact with conductive material disposed therein, and being deepened as well as widened near the die periphery to enhance the exposed surface area of conductive material for electrically connecting stacked dice. Enlarged pads may be formed at intended OLB locations on the active surface. Another blanket or patterned dielectric layer may be disposed over the bond pads and traces, to provide a patterned layer having an array of openings therethrough at the OLB locations. A conductive material such as solder or gold may be placed upon the enlarged pads of conductive material exposed through each of the array of openings to form an array of discrete conductive elements on the enlarged pads.

The present invention also encompasses single and multi-die assemblies and packages fabricated in accordance with the foregoing methods and incorporating the disclosed structures, as well as intermediate structures in the form of semiconductor wafers prior to singulation.

In another embodiment, a probe card configured for simultaneously probing a plurality of semiconductor dice is formed. A plurality of contacts configured as pillars is formed at locations on a substrate to protrude from a surface thereof, the plurality of contacts being located in a plurality of groups, each contact group corresponding in pattern and pitch to the pattern and pitch of a group of bond pads on a semiconductor die of a plurality of semiconductor dice to be simultaneously probed, and being spaced from adjacent contact groups in like manner to the spacing of adjacent bond pad groups. The contact tips are formed or coated with a conductive material and are in conductive communication with relatively short conductive traces carried on the surface of the substrate. Bond wires are then extended from the ends of the conductive traces to terminals or short traces at the substrate periphery, or extended over the periphery of the substrate to terminals on a probe card carrier. In some embodiments, bond wires connected to traces associated with some contacts are routed between other contacts as they extend toward a periphery of the probe card. In such embodiments, the sides of the contacts between which the bond wires extend may be electrically insulated to eliminate shorting between a contact and a bond wire. The bond wires may be disposed in trenches etched or otherwise formed in the substrate material, may be coated with a dielectric material, or both.

It is also contemplated that a substrate sized and configured for contacting bond pads of only a single die may be fabricated in accordance with the present invention, as described in the preceding paragraph. Such a substrate has utility, for example, for testing a single die (as in testing for known good die, or KGD) by providing a temporary interconnect between the bond pads of a semiconductor die and a carrier, or as an interposer between the bond pads of the semiconductor die and external connections of a package in which the die is assembled.

In a variation of the foregoing embodiments relating to single and multi-die substrates in the form of interconnects, interposers and probe cards, a multi-layer substrate is employed wherein one or more "windows" are formed through an upper substrate layer and electrical connections extended from contacts surrounding or otherwise adjacent the windows to terminal pads of circuit traces are carried on the lower substrate layer.

In yet another aspect of the invention, a wafer or die may be structured with one or more resilient dielectric elements disposed on an active surface thereof, and bond wires extended over the resilient elements between bond pads and other locations, such as OLB locations. The resilient dielectric elements enable non-damaging mechanical contact of, for example, contact elements of a test head with the bond wires supported by the resilient elements.

In the description which follows, like features and elements have been identified by the same or similar reference numerals for ease of identification and enhanced understanding of the disclosure hereof. Such identification is by way of convenience for the reader only, however, and is not limiting of the present invention or an implication that features and elements of various components and embodiments identified by like reference numerals are identical or constrained to identical functions.

Referring now to FIG. 1 of the invention, semiconductor wafer 100 comprises a plurality of unsingulated semiconductor dice 102, each of which bears bond pads 104 in a row along a central axis and on an active surface 106 of semiconductor wafer 100, according to a selected pinout design. It should be understood, however, that such a bond pad configuration is not a requirement of the invention, and that bond pads in two central rows or one or more peripheral rows, or other arrangements, may be employed in the present invention.

As used herein, the term "wafer" may comprise, without limitation, any bulk semiconductor substrate (e.g., a full or partial wafer of a semiconductor material, such as silicon, gallium arsenide, indium phosphide, polysilicon, a silicon-on-insulator (SOI) type substrate, such as silicon-on-ceramic (SOC), silicon-on-glass (SOG), or silicon-on-sapphire (SOS), etc.), that may include a plurality of semiconductor dice thereon. If wafer 100 is a conventional semiconductor wafer, wafer 100 may be a full thickness (e.g., 730 µm) wafer as received from a vendor or a wafer that has been substantially thinned as by back grinding or wet etching, after fabrication of the integrated circuitry of the semiconductor dice 102 thereon. As discussed below, it may be desirable in some instances to employ a full thickness wafer when stacking dice according to the present invention.

As can be seen in FIG. 1, bond wires 108 are disposed across streets 110 lying between adjacent semiconductor dice 102 and extend between a bond pad 104 of one die 102 and a bond pad of an adjacent die 102. As may be seen in FIG. 1, the direction a bond wire 108 is extended may reverse from one bond pad 104 to a next adjacent bond pad 104, to provide greater spacing or "pitch" between laterally adjacent bond wires 108 extending in the same direction. Bond wires 108 may comprise, for example, 0.9 mil (23 µm) gold bond wires, which are attached to bond pads 104 using thermosonic or thermocompression bonding, as known to those of ordinary skill in the art. A wafer map may be used in conjunction with control software for the wire bonder, to dictate placement of bond wires 108. It is also contemplated that wires of any other readily bondable metal or metal alloy may be employed including, but not limited to, aluminum and copper. Further, wires of various cross-sections may be employed, such as a substantially circular or a rectangular cross-section may be employed, the latter being termed "ribbon wire," which is commonly used in aluminum wedge bonding.

Figure 2:
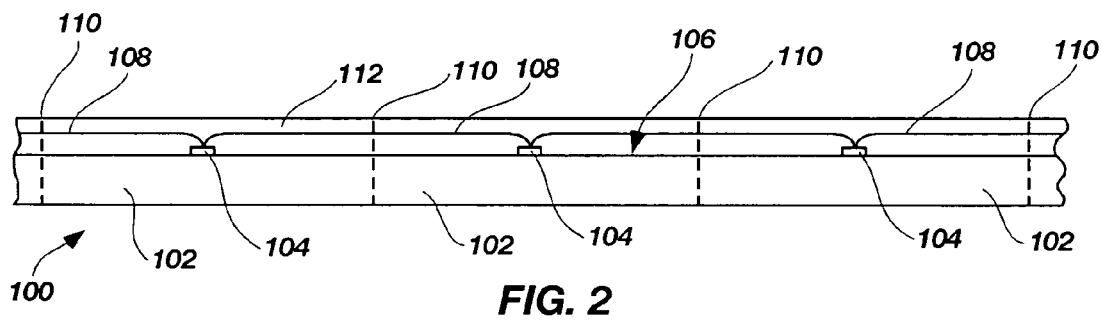
FIG. 2 is a side sectional elevation of the wafer portion of FIG. 1 after the bond wires are encapsulated with a dielectric material.

As may be seen in FIG. 2, bond wires 108 extend above the active surface 106 of semiconductor wafer 100. Prior to singulation of semiconductor dice 102, a dielectric material 112 may be disposed over the active surface 106 of the semiconductor wafer 100 to a depth sufficient to surround and encapsulate the bond wires 108. Dielectric material 112 may comprise, by way of example only, an epoxy, an underfill material, a spin-on polymer such as a polyimide, or a photocurable material such as a UV-wavelength curable polymer. One suitable dielectric material is NoSWEEP™ silica-filled, UV curable epoxy wire bond encapsulant offered by Kulick & Soffa, Willow Grove, Pa., U.S.A. Other suitable dielectric materials include the SUMIRESIN EXCEL® CRP product line, offered by Sumitomo Bakelite Co., Ltd. of Tokyo, Japan. Another suitable dielectric material is Nagase CHEMTEX™ liquid encapsulant offered by Nagase ChemteX Corporation, Osaka, Japan.

Figure 3A:
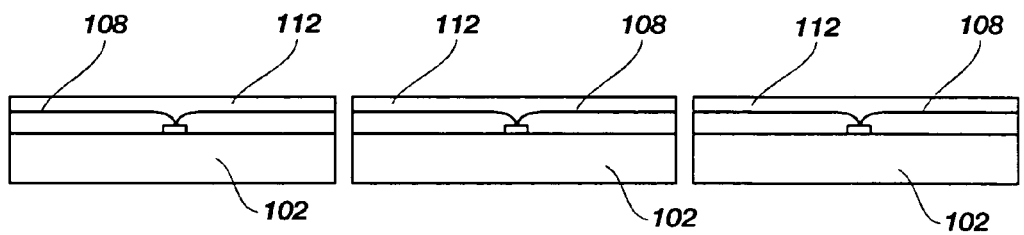
FIG. 3A is a side sectional elevation of the wafer portion of FIG. 1 after singulation of the dice.

After curing or otherwise solidifying of dielectric material 112, wafer 100 is singulated as known in the art (such as, for example, by use of a wafer saw), separating semiconductor dice 102 as depicted in FIG. 3A.

Figure 3B:
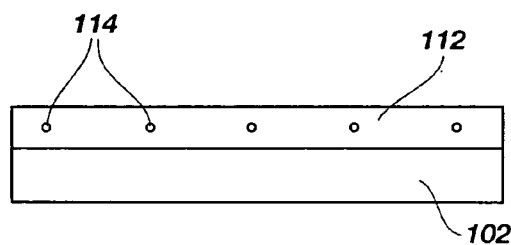
FIG. 3B is a side edge view of a die of FIG. 3A, showing exposed bond wire ends.
Figure 6A:
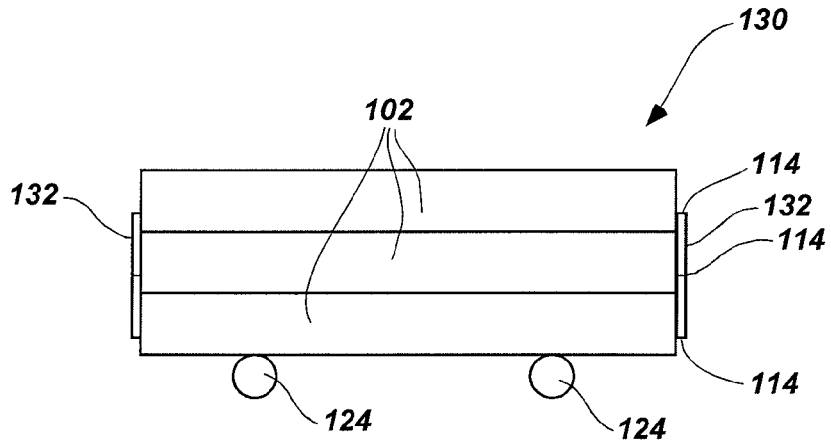
FIG. 6A is a side elevation of the die of FIG. 4B with discrete conductive elements disposed on the distal ends of the loop portions, and with additional dice as shown in FIG. 3A stacked thereon and electrically connected thereto.
Figure 6B:
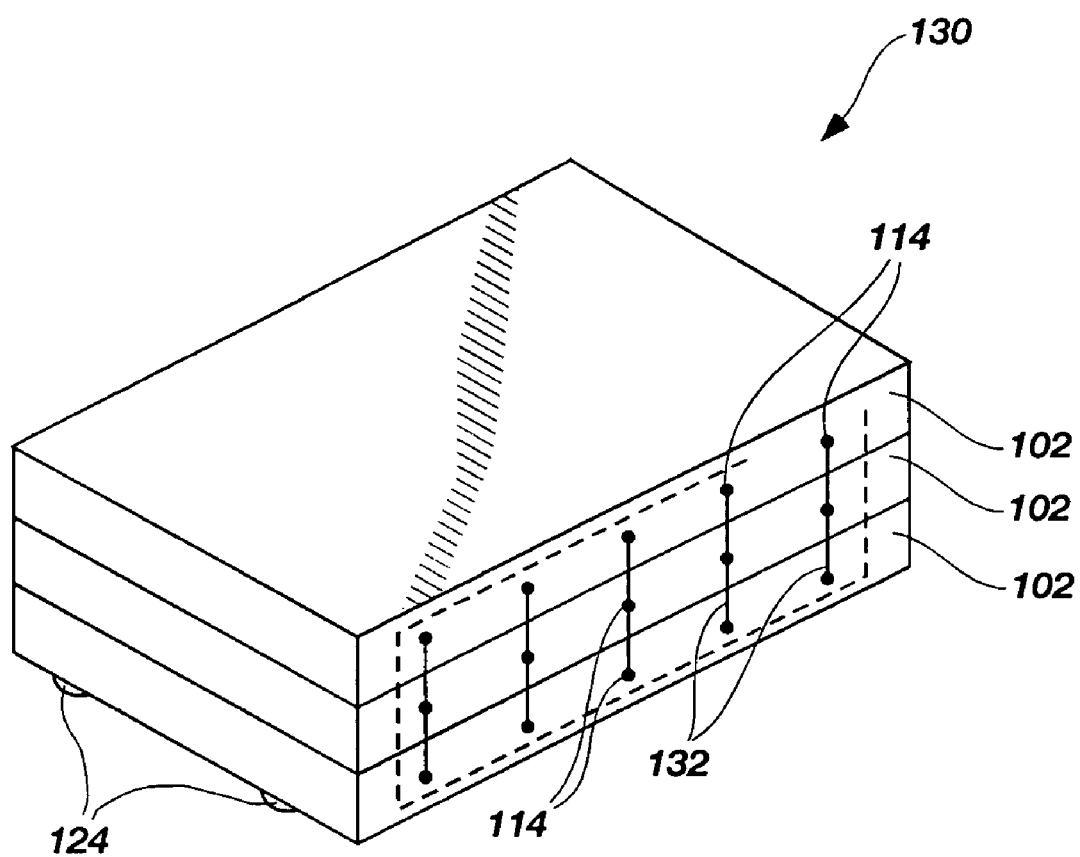
FIG. 6B is a perspective view of the die stack of FIG. 6A.

As is shown in FIG. 3B, singulation of semiconductor dice 102 results in exposed bond wire ends 114, which may be used for vertically electrically interconnecting a plurality of semiconductor dice 102 in a stack, as further depicted and described with respect to FIGS. 6A and 6B.

Figure 4A:
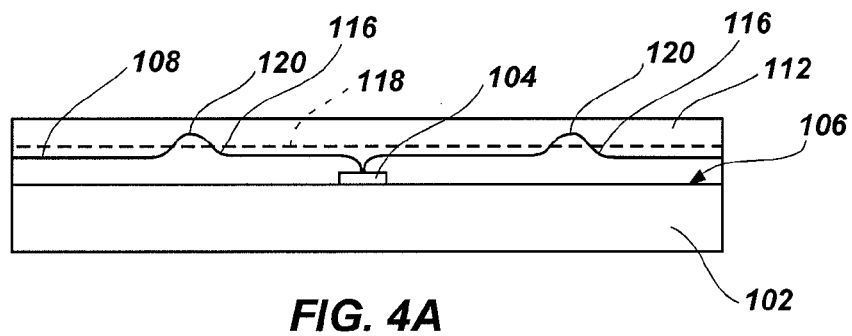
FIG. 4A is a side view of a die having bond wires with loop portions protruding away from the die surface, the bond wires being encapsulated in a dielectric material.
Figure 4B:
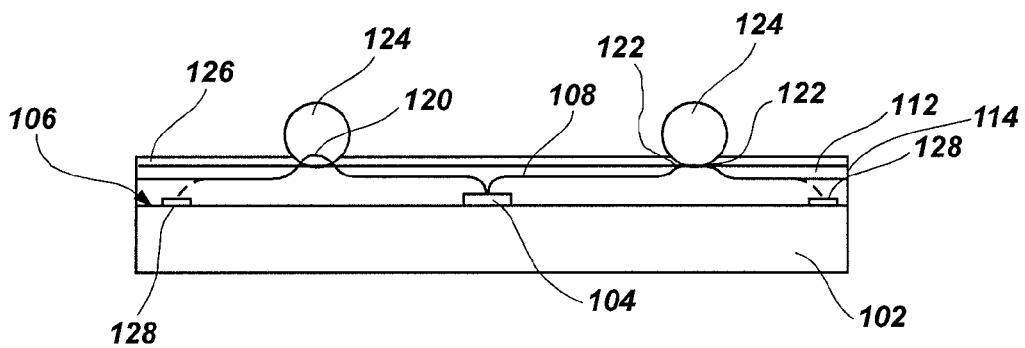
FIG. 4B is a side view of the die of FIG. 4A, after removal of the dielectric material to expose distal ends of the loop portions.

Referring now to FIGS. 4A and 4B, the semiconductor dice 102 of a wafer 100 may have bond wires 108 formed with loop portions 116 protruding away from the active surface 106 and distally from the plane along which the bond wires 108 substantially extend. As a consequence, after encapsulation with dielectric material 112 and before singulation of semiconductor dice 102 from wafer 100, a portion of the dielectric material 112 may be removed down to a level shown in broken line 118 on FIG. 4A by mechanical abrasion or chemical or plasma etching. If abrasion (grinding or chemical-mechanical polishing (CMP)) is employed, the distal end or bight 120 of loop portion 116 may be entirely removed as shown at the right-hand side of FIG. 4B, exposing two bond wire ends 122, one leading to bond pad 104 and one leading to an exposed bond wire end 114 at the periphery of semiconductor die 102. If an etchant is employed to remove the dielectric material 112, then the bight 120 is exposed as shown at the left-hand side of FIG. 4B. In either instance, a discrete conductive element 124 may be formed or disposed on either exposed wire bond ends 122 or bight 120 to form a flip-chip-configured die. For example, a solder paste may be stenciled or screen-printed at locations of loop portions 116 on semiconductor dice 102, and then heated to reflow to form discrete conductive elements 124 in the form of solder balls as shown, and bond to bond wires 108. A solder mask 126 may be applied and patterned, as known in the art and as shown in broken lines, before the solder paste is applied, to constrain lateral spread of solder upon reflow and enhance formation of solder balls of uniform height and diameter. In lieu of solder, discrete masses of another metal or alloy may be placed to form conductive elements 124 in the form of stud bumps, as known in the art. Further, a conductive or conductor-filled epoxy may be disposed at the locations of loop portions 116 to provide discrete conductive elements 124 in the form of studs, bumps, columns, pillars or other suitable shapes, and cured to a tacky or "B" stage to hold their physical forms before being finally cured to bond to terminals of higher-level packaging to which semiconductor die 102 is to be connected. Further, as shown in broken lines in FIG. 4B, if the depicted semiconductor die 102 is not to be used in a stacked configuration, bond wires 108 may be terminated short of the lateral periphery of the die, and (for example) have the ends thereof terminate at bonds to electrically isolated metal pads 128 formed adjacent the periphery on active surface 106. In addition, if it is undesirable for some reason to use discrete conductive elements for external connection to higher-level packaging, an anisotropic (so-called "Z-axis") conductive adhesive film may be placed over the surface of dielectric material 112 having the exposed distal ends of loop portions 116 thereon.

Figure 5A:
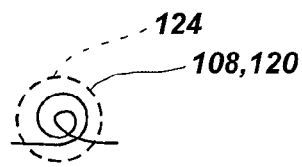
FIG. 5A is a top elevation of a coil configuration for a distal end of a bond wire loop portion.
Figure 5B:
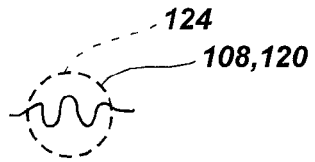
FIG. 5B is a top elevation of a serpentine configuration for a distal end of a wire bond loop portion.

As respectively depicted in FIGS. 5A and 5B, a wire bond capillary used to form and guide the path of bond wires 108 may be used to coil the distal end of a loop portion of a bond wire 108, or to provide a serpentine configuration for a loop portion of a bond wire 108, to increase exposed wire area at the distal end of the loop portion and provide additional bonding surface area for mechanical and electrical connection of a solder ball or other discrete conductive element 124 thereto. Capillary movement is generally controlled by software programmed with the desired movements for the capillary.

As depicted in FIGS. 6A and 6B, a semiconductor die 102 as described with respect to FIG. 4B may be placed at the bottom of a stack of one or more additional semiconductor dice as described with respect to FIG. 3A, each semiconductor die 102 mutually superimposed with and bonded to at least one other semiconductor die 102 so that exposed bond wire ends 114 of the stacked dice are vertically aligned on each of two opposing sides of the resulting die stack 130. The exposed bond wire ends 114 may then be electrically connected by vertical interconnects 132 to electrically connect the integrated circuitry of the stacked semiconductor dice 102, the collective circuits then being connectable to higher-level packaging through the discrete conductive elements 124 carried by the lowermost semiconductor die 102. Such electrical connection may be effected by vertical interconnects formed by wire bonding between the exposed bond wire ends 114, by screen or stencil printing a conductive material therebetween in the form of conductive traces, or by using so-called "micro-jet" or "micro-pen" technology to form conductive traces of a metal or a conductive or conductor-filled polymer using precise, rapid deposition of small droplets of the selected material in the manner initially developed for ink-jet printing. MicroFab Technologies, Inc. of Plano, Tex., USA offers equipment and services to implement this technology. It may also be desirable to use ganged traces carried on a flexible dielectric substrate (as shown in broken lines) such as is employed in so-called TAB (tape automated bonding) to simultaneously place a plurality of vertical interconnects 132 on a side of a die stack 130 and connect them to exposed bond wire ends 114. As noted above, the use of semiconductor dice singulated from a full-thickness wafer may be beneficial due to the enhanced vertical spacing provided by use of same; this may be particularly beneficial if wire bonding or TAB bonding is employed to connect the vertical interconnects 132 to exposed wire bond ends 114. Such thicker dice also allow better heat transfer from interior portions of a dice stack by providing greater material volume and surface area for heat dissipation.

As noted above with respect to FIG. 1 of the drawings, it may be desirable to extend bond wires 108 in opposing directions from adjacent bond pads 104. For example, conventional bond pads may be spaced, or pitched, at about 130 μm intervals, which may make it difficult for a wire bond capillary or other tool used to conductively connect exposed bond wire ends 114 avoid contact with an adjacent exposed bond wire end 114, if adjacent bond pads 104 have bond wires extending therefrom in the same direction. By alternating the directions of bond wires 108 from adjacent bond pads 104, the spacing or pitch is doubled to about 260 μm, providing additional clearance for tools and permitting the formation of much wider vertical conductive interconnects if desired, lowering required tolerances for placement of the interconnects while still precluding lateral shorting to an adjacent interconnect or exposed bond wire end 114. In addition, increased bond wire separation distances enhances electrical performance, by reducing crosstalk between wires.

FIG. 7A depicts a semiconductor die 102 of semiconductor wafer 100 having guide posts or pins 140, OLB posts 142, guide comb elements 144 and jumper pads 146 disposed on active surface 106 on either side of bond pads 104, according to the present invention, and bond wires 108 routed from the bond pads 104 to the guide posts or pins 140, to the OLB posts 142 and across a street 110 to an adjacent die 102 (not shown), the bond wires 108 optionally being either routed through a guide comb element 144 or wire bonded to a metal jumper pad 146 before extending across the street 110. Of course, guide posts or pins 140 may be placed inwardly or outwardly of OLB posts 142, as desired or required. Further, it is contemplated that either guide comb elements 144 or jumper pads 146, as well as various combinations thereof, may be used on the same semiconductor die 102. Structures in the form of guide posts or pins 140, OLB posts 142 and guide comb elements 144 may be formed, for example, using stereolithographic techniques employing suitably programmed equipment offered by 3D Systems of Valencia, Calif., USA, Objet Geometries Ltd. of Rehovot, Israel, or MicroFab Technologies, Inc. of Plano, Tex. to selectively deposit and cure a suitable polymer material directly on active surface 106 of wafer 100, or on a thin dielectric film which is subsequently aligned with and adhered to active surface 106 of semiconductor wafer 100, the film having appropriately located, sized and configured slots therein for exposing bond pads 104. Such structures may also be molded directly onto the surface of semiconductor wafer 100, or preformed and applied thereto in decal form or adhesively bonded thereto. It should be recognized that, for example, guide posts or pins 140, OLB posts 142 and guide comb elements 144, whether formed by stereolithographic techniques, or otherwise, may comprise elastomeric materials to reduce coefficient of thermal expansion (CTE) stress on the semiconductor dice fabricated from wafer 100 and bond wires 108 thereon during thermal cycling, as well as during exposure to vibration. Jumper pads 146 may be formed from the same level of metallization used to form bond pads 104.

FIG. 7B depicts a semiconductor die 102 with portions of two other adjacent semiconductor dice 102 in unsingulated form. As shown on the right-hand side of the center semiconductor die 102, bond wires 108 may be run through guide posts or pins 140 before reaching an OLB post 142, or directly to an OLB post 142, and then through a guide comb element 144 before passing across a street 110 to an adjacent semiconductor die 102. Alternatively, bond wires 108 may be bonded to a jumper pad 146 before passing across a street 110 to an adjacent semiconductor die 102 as shown on the left-hand side of the center semiconductor die 102. Obviously, both sides of a given semiconductor die 102 would normally be configured identically with the features illustrated, FIG. 7B merely showing two alternative arrangements for purposes of illustrating the adaptability and flexibility of the present invention.

FIGS. 8A and 8B are frontal and side elevations, respectively, of a slotted guide post 140 or OLB post 142 (the structures being similar, the OLB posts 142 being of larger diameter for placement of a discrete conductive element thereon) having a bond wire 108 disposed in the slot S thereof and a discrete conductive element 124 disposed thereon as shown in broken lines. FIG. 8C is an example of an OLB post 142 having a cap C thereon, a bond wire 108 wrapped thereabout and a discrete conductive element 124 disposed thereon, as shown in broken lines.

It should be recognized that guide posts or pins 140, OLB posts 142 and guide comb elements 144 may also function as "spacers" to control the standoff distance between vertically adjacent semiconductor dice in a stack. Further, should no dielectric material 112 be employed, the spacers may provide passages between vertically adjacent dice to enhance cooling thereof through either passive or active fluid flow through the passages.

The use of guide posts or pins 140, OLB posts 142, guide comb elements 144 and jumper pads 146 may provide greater accuracy in placement of long bond wires 108 and OLB posts 142 a more robust mechanical and electrical connection to a discrete conductive element 124. Further, the use of such structures facilitates the formation of more highly populated arrays of discrete conductive elements 124 on a semiconductor die 102 while avoiding the potential for lateral wire-to-wire shorting. After bond wires 108 are suitably placed and secured, a dielectric material 112 may be disposed over active surface 112 and cured, portions of bond wires 108 exposed if the semiconductor dice 102 are to have discrete conductive elements 124 formed or disposed thereon and the discrete conductive elements 124 placed, after which the semiconductor wafer 100 may then be singulated and, as desired, semiconductor dice 102 stacked, all as described above. Again, an anisotropic conductive film may be employed in lieu of discrete conductive elements 124.

Figure 9:
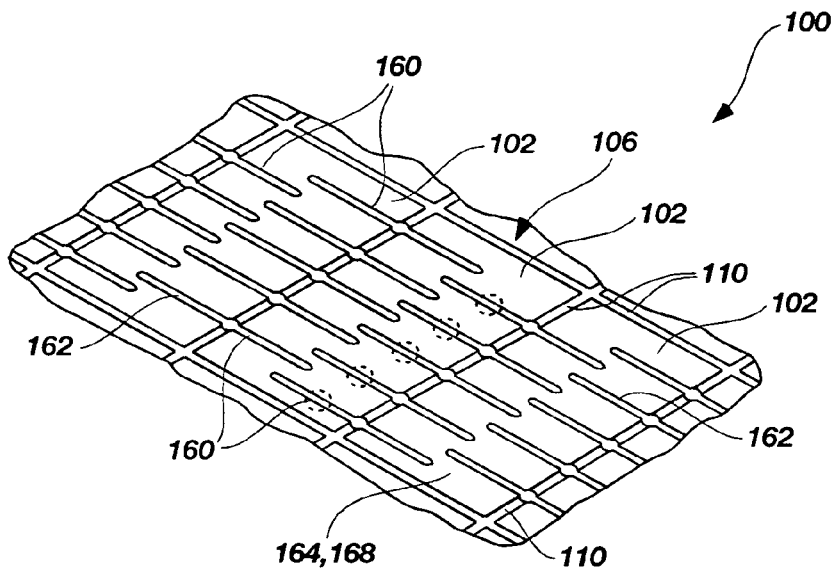
FIG. 9 is a perspective view of a portion of a semiconductor wafer, showing a plurality of mutually adjacent dice prior to singulation thereof with conductive traces extending between adjacent dice and across intervening streets between the dice.

FIG. 9 is a perspective view of a portion of a semiconductor wafer 100, showing a plurality of mutually adjacent dice 102 prior to singulation thereof with conductive traces 160 extending between adjacent semiconductor dice 102 and across intervening streets 110 between the semiconductor dice 102. While in actuality layers of dielectric material 164 and 168 as discussed below cover conductive traces 160, conductive traces 160 are shown as if these layers are transparent, for clarity of illustration.

Figure 10:
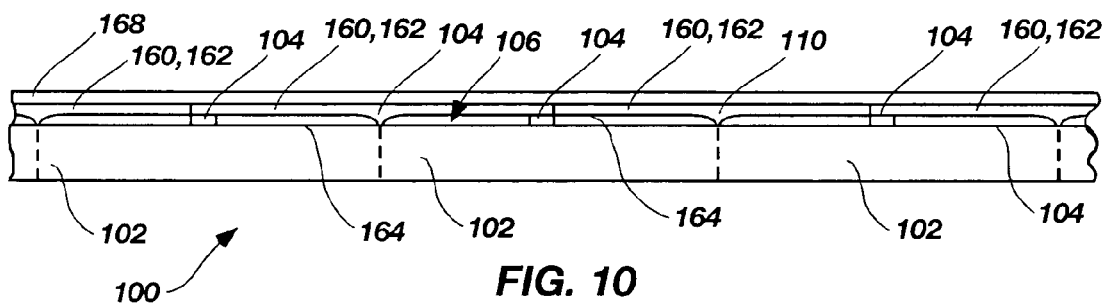
FIG. 10 is a side sectional elevation of the semiconductor wafer portion of FIG. 9.

As may be appreciated from FIG. 10, which is a side sectional elevation of the wafer portion of FIG. 9, conductive traces 160 may be disposed in channels or trenches 162 formed in a layer of dielectric material 164 which may be deposited in a suitable pattern to form the layer with channels or trenches using the aforementioned stereolithographic technology available from any of 3D Systems, Objet Geometries Ltd. and MicroFab Technologies, Inc. While it is also contemplated that a patterned photoresist may be used as the layer of dielectric material 164, stereolithographic techniques afford enhanced flexibility in fabricating three-dimensional structural details, as will be explained hereinafter. Furthermore, it is contemplated that conductive traces 160 may be formed on top of layer of dielectric material 164 rather than disposed in channels or trenches.

Dielectric material 164 may be placed, for example, in a layer about 25 μm thick, leaving bond pads 104 exposed. Channels of, for example, about 15 μm in depth and about 70 μm in width are defined during formation of the layer of dielectric material 164 in communication with the exposed bond pads 104 and extending to a desired remote location. For example, a channel or trench 162 may extend to and across a street 110 between adjacent semiconductor dice 102 to a bond pad of an adjacent semiconductor die 102, in the manner in which bond wires 108 are run in the previous embodiment. The 15 μm depth of the channel or trench 162 maintains sufficient dielectric material under a conductive trace 160 disposed in the channel or trench 162 to minimize capacitive coupling with underlying circuitry formed in or on the active surface 106 of wafer 100.

Using stereolithographic techniques, channel or trench 162 may also be formed to flare laterally outwardly and increase in depth as shown adjacent the periphery of a semiconductor die 102 at the location of a street 110, and maintain the increased width and depth across the street 110 before tapering inwardly and upwardly to a reduced width and depth past the periphery of the adjacent semiconductor die 102 across the street 110. Thus, when semiconductor dice 102 are singulated from wafer 100, the exposed trace ends 166 at the periphery of each semiconductor die 102 are of substantially increased surface area to facilitate connection with a subsequent formed vertical interconnect in a die stack. If a semiconductor die 102 is not to be stacked with other semiconductor dice, the channel 162 may terminate at an OLB location wherein a discrete conductive element is to be subsequently disposed. The OLB location of the channel or trench 162 may comprise a pad enlarged in lateral dimension, and comprise a selected shape, such as a circle or square or other polygon, whether or not the die is to be stacked with others. Use of stereolithographic techniques also provides an opportunity to run a plurality of nonlinear channels easily to selected OLB locations if it is desired or necessary to fabricate a highly populated array of discrete conductive elements. If desired, the layer of dielectric material 164 may be subjected to grinding or CMP techniques to planarize the surface thereof for a robust and repeatable result if a squeegee blade is to be used to move a conductive material into channels or trenches 162 to form conductive traces 160.

Conductive traces 160 may be formed in channels or trenches 162 or over layer of dielectric material 164 by selectively depositing a conductive ink or powdered metal, by sputtering and patterning a blanket layer of metal using conventional resist and etch techniques, or by printing. A metal paste may be deposited into channels or trenches 162 using a squeegee blade in a stencil printing operation. Any other suitable method known to those of ordinary skill in the art may also be employed, without limitation of the present invention. In one example, 2 μm thick aluminum traces may be formed for compatibility with bond pads 104, with an additional thickness of 5 μm of nickel plated thereon, either on top of layer of dielectric material 164 or within channels or trenches 162. Conductive signal traces 160 may be, for example about 40 μm in width, while conductive power, ground and bias traces 160 may be on the order of 70 μm or greater in width. As noted above, it is contemplated that conductive traces 160 may be formed on the upper, exposed surface of the layer of dielectric material 164, communicating with bond pads 104 through vias in the layer of dielectric material 164. After the conductive material is consolidated in channels or trenches 162 to form conductive traces 160 or disposed over the layer of dielectric material 164, another layer of dielectric material 168 may be either blanket deposited over conductive traces 160 and dielectric material 164 (for example, if no OLB locations are to be provided on a given semiconductor die 102) or selectively deposited or blanket deposited and patterned (if OLB locations are to be exposed) for placement of discrete conductive elements 124 at OLB locations. Use of channels and trenches is particularly suitable for formation of copper traces.

Figure 11A:
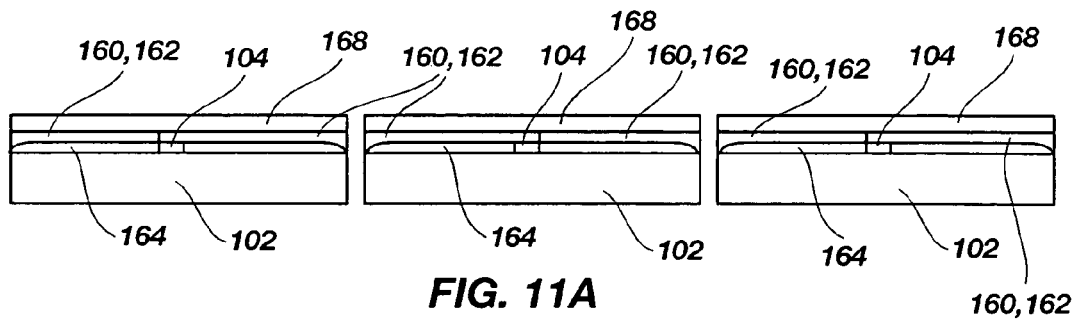
FIG. 11A is a side sectional elevation of the semiconductor wafer portion of FIG. 9 after singulation of the dice.
Figure 11B:
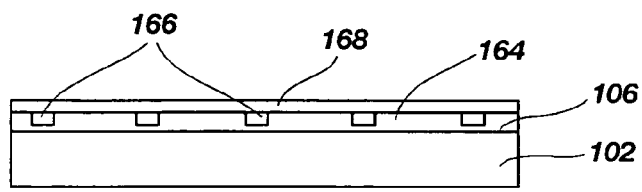
FIG. 11B is a side edge view of a die of FIG. 11A, showing trace ends exposed by singulation of the dice.

FIG. 11A is a side sectional elevation of the wafer portion of FIG. 9 after singulation of the semiconductor dice 102 along streets 110, and FIG. 11B is a side edge view of a die of FIG. 11A after singulation, showing the aforementioned enlarged, exposed trace ends 166.

As with the first embodiment, semiconductor dice 102 may be stacked in an arrangement as depicted in FIGS. 6A and 6B with discrete conductive elements 124 disposed on enlarged OLB locations on the conductive traces 160, the stacked semiconductor dice 102 as shown in FIG. 11A electrically connected thereto to form a die stack 130. Vertical interconnects 132 may be formed to connect exposed trace ends 166 of the various semiconductor dice 102. As noted previously, vertical interconnects 132 may comprise bond wires, TAB connections, screen- or stencil-printed conductive traces or micro-jet formed conductive traces. As with conductive traces 160, vertical interconnects may comprise a first layer of aluminum, applied for example using micro-jet techniques, followed by plating of an additional layer, for example of nickel. It is also contemplated that semiconductor dice 102 configured with bond wires 108 may be combined in a die stack with semiconductor dice 102 configured with conductive traces 160. Further, it is contemplated that conductive traces 160 may alternate in direction away from adjacent bond pads 104, and that semiconductor dice configured for performing different functions (e.g., memory, logic, processing) may be combined in a single die stack to form a "system in a stack."

Figure 12:
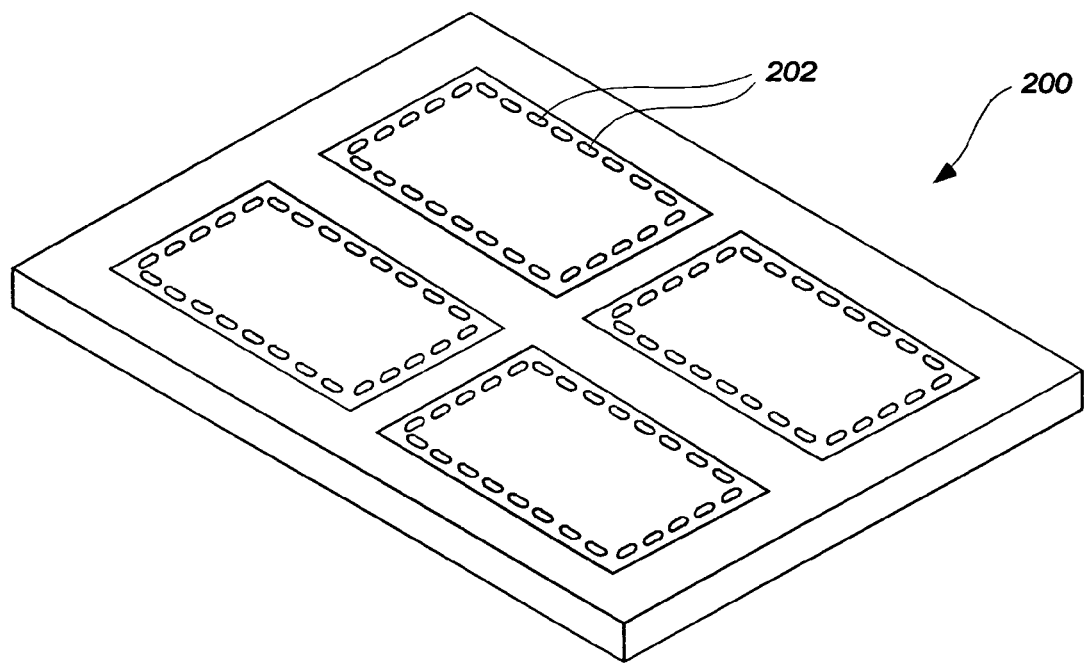
FIG. 12 is a perspective, schematic view of an embodiment of a substrate according to the present invention configured as a probe card for simultaneous testing of multiple semiconductor dice, and which may also be configured for contact with a single semiconductor die for use in testing thereof or assembly therewith.

FIG. 12 is a perspective, schematic view of an embodiment of a probe card substrate 200 according to the present invention, wherein probe card substrate 200 may comprise, for example, a silicon substrate having contacts 202 configured as pillars formed thereon by a mask and etch technique, as is known in the art. Probe card substrate 200 is configured for simultaneous probe testing of a plurality of semiconductor dice (in this example embodiment, four dice) in unsingulated form on a semiconductor wafer. As previously noted, however, a similar substrate may be fabricated which is configured for contact with a singulated semiconductor die, and used for (by way of example only) as an interconnect for KGD testing or as an interposer in a semiconductor device package, The bond pad configuration for testing of each of the four dice in the example requires that contacts 202 be disposed in a rectangle corresponding to die size and spacing on the wafer to be tested and as illustrated by the rectangles surrounding contacts 202 in FIG. 12, such a configuration being conventional for many semiconductor devices. As may be easily seen, some of the contacts 202 are located peripherally on probe card substrate 200 while others of contacts 202 are more centrally located, with peripherally located contacts disposed between the more centrally located contacts and any periphery of probe card substrate 200. Thus, running conductive paths from inner contacts 202 to locations at the periphery of probe card substrate 200 may prove difficult due to the presence of peripheral contacts 202 at close pitches required by the bond pad pattern, and the use of conductive traces, such as aluminum thin film sputtered traces, extending from contacts, as is conventional with some probe cards, may require a substrate with multiple levels of metallization, which is expensive, poses reliability problems over the long term, and is subject to excessive capacitance.

Figure 13:
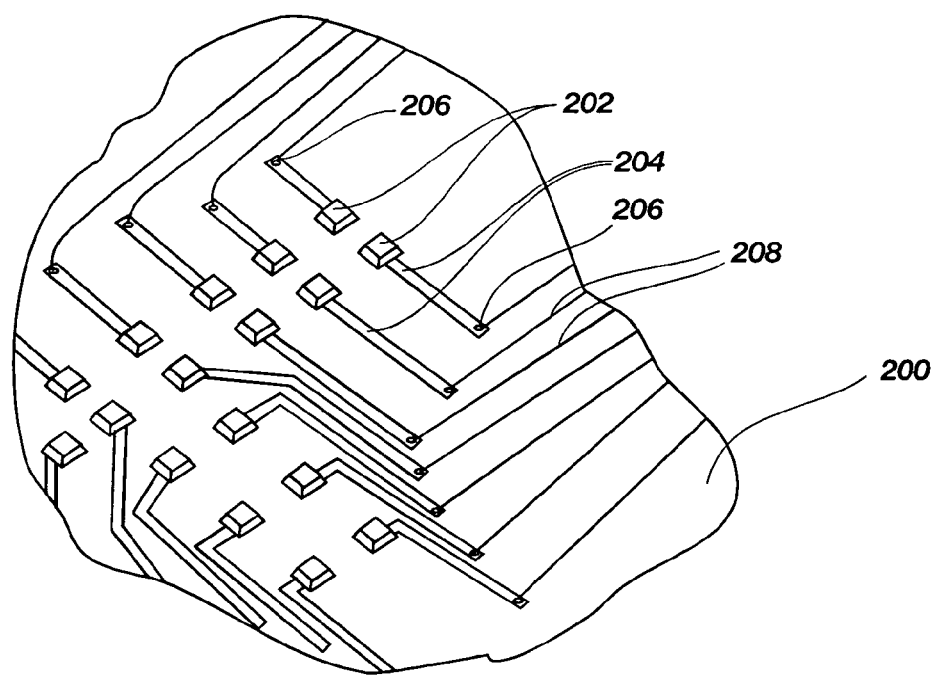
FIG. 13 is an enlarged perspective view of one portion of the substrate of FIG. 12.
Figure 14:
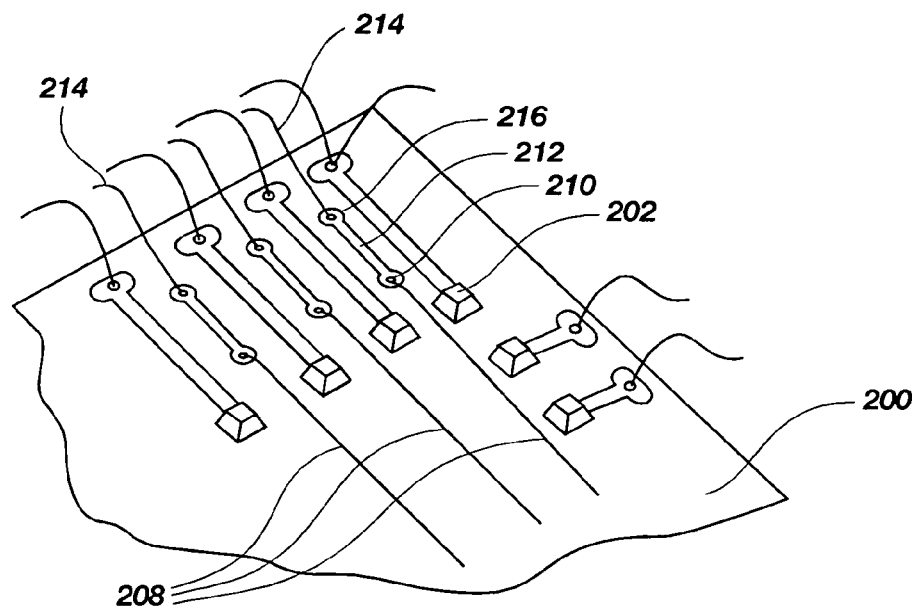
FIG. 14 is an enlarged perspective view of another portion of the substrate of FIG. 12.

Accordingly and as depicted in FIGS. 13 and 14, relatively short conductive traces 204 are extended from more central contacts 202 to terminal pads 206, at which point bond wires 208 are extended from terminal pads 206 and between, for example, more peripheral contacts 202, to inner terminal pads 210 of truncated conductive jumper traces 212 peripherally outward of more peripheral contacts 202 and proximate the edge of probe card substrate 200. Bond wires 214 may then be extended from outer terminal pads 216 of jumper traces 212 beyond the edge of probe card substrate 200 to terminals on a probe card carrier (not shown) to which probe card substrate 200 is mounted. In the case of a substrate configured for contact with a singulated semiconductor die, bond wires 214 may also be bonded down to traces on a substrate such as a printed circuit board used in a KGD carrier package. The use of bond wires 208 and 214 minimizes capacitance and increases inductance, enhancing probe card performance when used in combination with relatively short conductive traces 204 and conductive jumper traces 212. It is also noted that conductive jumper traces 212 may be omitted and bond wires 208 run directly to terminals on a probe card carrier, or bond wires 208 run and tacked to jumper pads 146 as depicted in FIG. 7A for securement before being further extended beyond the edge of probe card substrate 200. Peripheral contacts 202 may also have short traces 204 associated therewith, and bond wires 208 extended from terminal pads 206 directly to terminals of a probe card carrier.

FIG. 13 depicts relatively short conductive traces 204 which, rather than being linear, include at least one turn or angle therein and extend to terminal pads 206 placed so that bond wires 208 may be extended transversely from the traces 204 and toward an edge of probe card substrate 200. Bond wires 208 may extend between and in a direction transverse to a row of closely pitched more peripheral contacts 202 as shown in FIG. 14.

Figure 15:
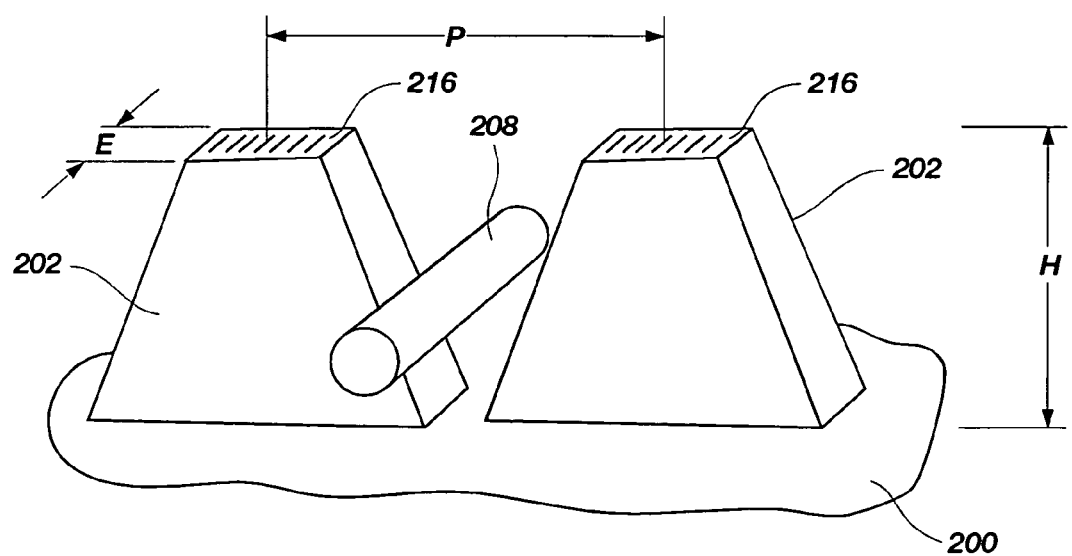
FIG. 15 is an enlarged perspective view of two adjacent pillar-shaped contacts on the substrate of FIG. 12 with a bond wire extending therebetween.

FIG. 15 is an enlarged perspective view of two adjacent pillar-shaped contacts 202 on the probe card substrate 200 with a bond wire extending therebetween. Again, as noted above, this structure may be employed on a substrate for contacting a singulated semiconductor die and for other purposes than use as a probe card. The sides of contacts 202 have been covered with a dielectric material such as a photoresist or other polymer such as a polyimide or a PARYLENE™ polymer, silicon dioxide, silicon nitride, etc., to electrically insulate them and prevent shorting by contact with bond wire 208 extending therebetween. Contacts 202 may comprise, for example, pillars of about 50 μm to about 80 μm in height H, with about a 150 to 200 μm center-to-center pitch P, and provide about a 40 μm on edge B square upper, metallized surface of terminal pad 216 for contacting a bond pad of a die to be probe tested. If etched from a silicon material in the manner used to form silicon inserts for KGD testing, an isotropic wet or dry etch may be selected to provide the truncated pyramidal configuration, with 55° wall inclination, as shown. If a 25 μm diameter aluminum bond wire 208 is run between contacts 202, there is ample vertical clearance between the surface of the probe card substrate 200 and the terminal pads 216 of contacts 202 to accommodate the bond wire 208 when a wafer is probed to ensure that bond wire 208 does not come in contact with the wafer when bond pads thereof are in contact with terminal pads 216. In addition, the adjacent contacts 202 serve as guides for bond wires 208 to prevent lateral shorting of adjacent bond wires. Further, and optionally, the bond wires 208 may be tamped flat against the surface of the probe card substrate 200, or placed in trenches or recesses etched in the probe card substrate 200, to enhance vertical clearance. A very thin dielectric layer, such as of so-called "glob top" dielectric material, may be placed over bond wires 208 to hold them in place.

Figure 16:
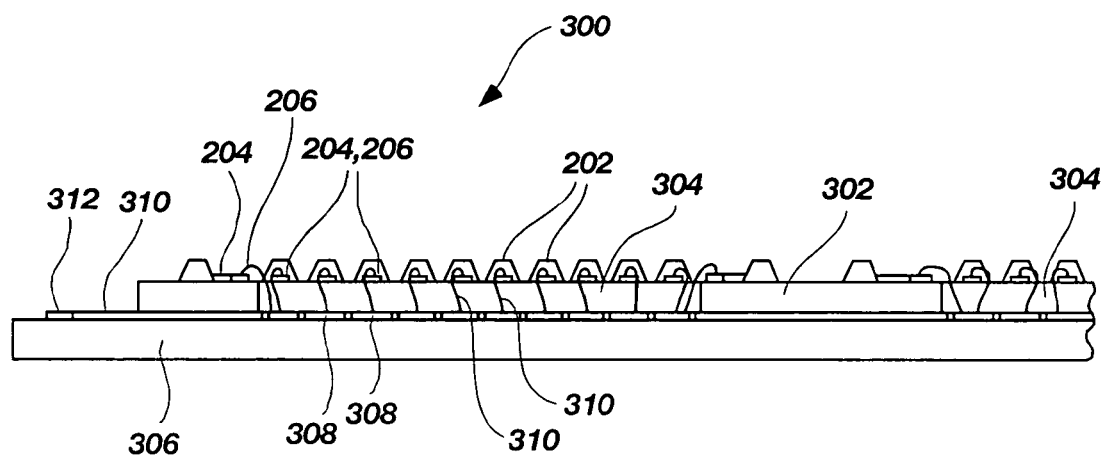
FIG. 16 is a side sectional elevation of a portion of another probe card embodiment of the present invention comprising a multi-layer probe card substrate and depicting electrical connections extending from contacts carried on an upper substrate layer to terminals of conductive traces carried on the lower substrate layer.

FIG. 16 depicts a variation of the foregoing embodiment, wherein a multi-layer probe card substrate 300 is employed. Upper substrate layer 302 carries a plurality of contacts 202 as described with respect to the preceding embodiment. As shown in section, contacts 202 and associated conductive traces 204 terminating at terminal pads 206 surround a window 304 etched or sawn through the thickness of upper substrate layer 302. After formation and metallization of contacts 202 and formation of conductive traces 204 (which may be effected simultaneously with metallization of contacts 202), upper substrate layer 302 is disposed over lower substrate layer 306, with terminal pads 308 of conductive traces 310 carried on the surface of lower substrate layer 306 exposed through window 304, conductive traces 310 extending between upper substrate layer 302 and lower substrate layer 306 to outer terminals 312 for connection to terminals of a probe card carrier (not shown), as known in the art. Electrical connection between terminal pads 206 and terminal pads 308 using bond wires formed with a wire bond capillary or using TAB tape connections, as desired. Thus, while peripherally outer contacts 202 may be connected directly to external circuitry using short conductive traces 204 and wire bonds or TAB connections as depicted in FIG. 14, for example, contacts 202 in more problematic, inner locations on probe card substrate 300 may be easily connected to external circuitry via conductive traces 310 carried by lower substrate layer 306. Alternatively and as shown in FIG. 16, all contacts 202 surrounding or otherwise proximate a window 304 may be connected to conductive traces 310 of a lower substrate layer 306.

Figure 17:
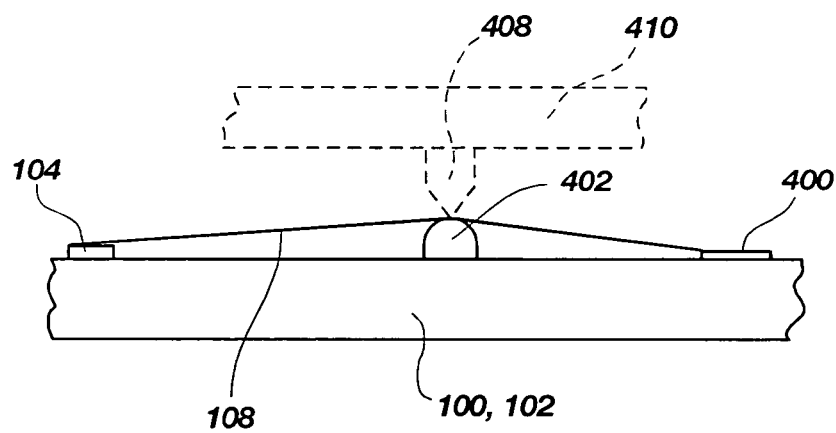
FIG. 17 is a side sectional elevation of a further embodiment of the present invention, wherein bond wires on a wafer or die are resiliently supported intermediate bond pad and OLB locations.

In yet another embodiment of the present invention depicted in FIG. 17, bond wires 108 may be extended between bond pads 104 on a wafer 100 or semiconductor die 102 and associated conductive OLB pads 400 over and in contact with a wall or discrete segments 402 of a suitably resilient dielectric material, such as an elastomeric material, silicone being one non-limiting example thereof. The resiliency of the elastomeric material permits bond wires 108 to move slightly up and down. This capability enables the bond wires 108 carried by wafer 100 or die 102 to safely, and without damage, contact test contacts or other conductive elements 408 carried on a substrate 410 thereabove and moved thereagainst as shown in broken lines, to establish electrical contact by mechanical force. Such capability may facilitate temporary contact of bond wires 108 for testing, prior to encapsulation of bond wires 108. In addition, the disclosed structure is suitable for use as a permanent connection, for example, for interconnecting stacked dice. Further, it is also suitable for use as a probe contact in a probe card or other substrate configuration.

Figure 18:
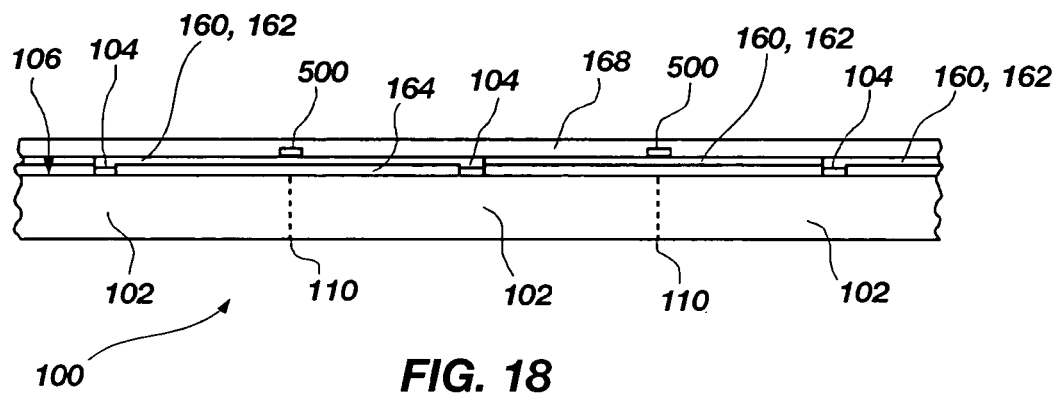
FIG. 18 is a side sectional elevation of yet another embodiment of the present invention, wherein conductive bumps are disposed on conductive traces in the street areas between semiconductor dice in wafer form.

In yet another variation of the present invention as depicted in FIG. 18, exposed ends of conductive traces may be provided with increased surface area to facilitate interconnection thereof, and to higher level packaging. Conductive traces 160 may be disposed in channels or trenches 162 formed in a layer of dielectric material 164 on semiconductor dice 102 of a semiconductor wafer 100 using the aforementioned stereolithographic technology or provided by a patterned photoresist. Alternatively, it is contemplated that conductive traces 160 may be formed on top of layer of dielectric material 164 rather than disposed in channels or trenches. A conductive bump 500 may be placed or formed on each conductive trace 160 over the streets 110 between adjacent semiconductor dice 102. Conductive bump 500 may comprise, for example, a gold stud bump of approximately 80 μm diameter and approximately 60 μm height, as shown, formed using a wire bond capillary.

Each conductive bump 500 may also be formed by printing, stenciling or extruding from a nozzle a drop or bump of conductive material, such as a conductive paste comprising conductive metal or alloy particles in a carrier, a conductive epoxy, or a conductor-filled epoxy. Further, preformed conductive bumps or balls may be disposed on conductive traces 160.

Figure 18A:
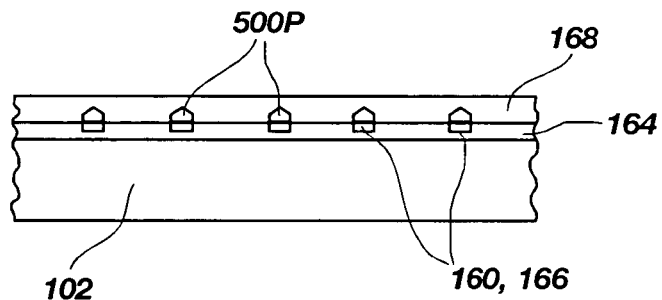
FIG. 18A is an end view of a portion of a semiconductor die after singulation along the streets.

Following formation or disposition of conductive bumps 500, another layer of dielectric material 168 may be either blanket deposited over conductive traces 160, dielectric material 164 and conductive bumps 500 (for example, if no OLB locations are to be provided on a given semiconductor die 102) or selectively deposited or blanket deposited and patterned (if OLB locations are to be exposed) for placement of discrete conductive elements at OLB locations, as previously described. Semiconductor wafer 100 is then cut along streets 110 to singulate semiconductor dice 102, the singulation process being effected through conductive bumps 500 placed over streets 110. The resulting singulated semiconductor dice 102 then present, as depicted in an enlarged view in FIG. 18A showing a portion of one such semiconductor die 102, trace ends 166 of conductive traces 160 surmounted by an associated, electrically connected partial conductive bump 500p exhibiting a far greater cross-sectional area to which electrical contact may be made for connecting semiconductor dice 102 in a stacked arrangement, to a carrier substrate, to both, or to another component or higher-level packaging.

Figure 19:
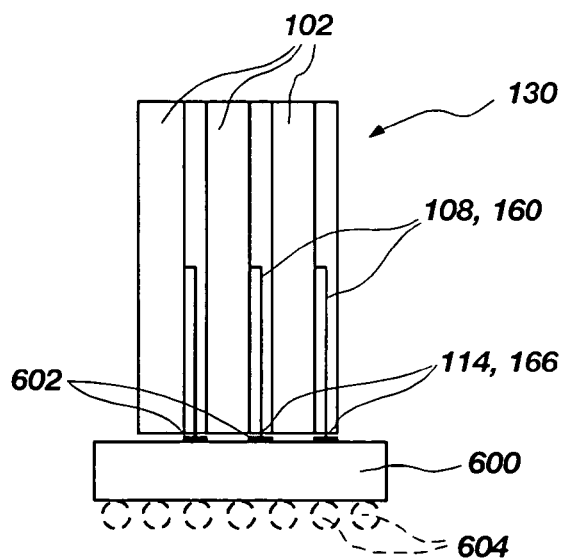
FIG. 19 is a schematic side elevation of a die stack of the present invention, attached in vertical surface mount (VSMP) fashion to a carrier substrate.

In a further variation of the present invention as depicted schematically in FIG. 19, stacked semiconductor dice 102 according to the present invention and having exposed ends 114 or 166 of bond wires 108 or conductive traces 166 at one side of the die stack 130 may be connected, in vertical surface mount fashion, to (as schematically shown) conductive elements 602 of a carrier substrate 600 such as leads of a leadframe, traces or terminal pads of a printed circuit board substrate, or traces or terminal pads of a plastic or ceramic interposer substrate configured for connection to higher-level packaging. In one variation, the substrate may be configured with a plurality of discrete conductive elements 604 (shown schematically in broken lines) configured as balls, bumps, studs, columns, pillars, pins or lands and, optionally, in an array.

As will be appreciated by one of ordinary skill in the art, the use of gold or copper bond wires or TAB type (dielectric film bearing conductive traces) connections in various embodiments of the present invention will beneficially lower capacitance in the devices and structures disclosed. Further, the devices and structures disclosed herein may be easily fabricated using existing equipment and processes with only minor modifications. Further, the equipment and processes which may be used to fabricate the disclosed devices and structures only require equipment and processes which may be employed after fabrication of a semiconductor device incorporating same, and not the more expensive and complex processes and equipment required to fabricate integrated circuitry.

While the present invention has been described in terms of certain illustrated embodiments and variations thereof, it will be understood and appreciated by those of ordinary skill in the art that the invention is not so limited. Rather, additions, deletions and modifications to the illustrated embodiments may be effected without departing from the spirit and scope of the invention as defined by the claims which follow.

What is claimed is:

1. A semiconductor device package, comprising:
    at least one semiconductor die assembly, comprising:
        a semiconductor die having an active surface with a plurality of bond pads disposed thereon;
        at least some bond pads of the plurality having conductors extending therefrom over the active surface to at least one peripheral edge of the semiconductor die; and
        dielectric material surrounding the conductors, extending to the at least one peripheral edge of the semiconductor die and having ends of the conductors exposed at the at least one peripheral edge of the semiconductor die assembly.

2. The semiconductor device package of claim 1, wherein the conductors comprise bond wires.

3. The semiconductor device package of claim 2, wherein the dielectric material comprises a dielectric layer encapsulating the bond wires.

4. The semiconductor device package of claim 3, wherein at least some of the bond wires include loop portions extending away from the active surface and having distal ends thereof exposed proximate a surface of the at least one dielectric layer above the active surface.

5. The semiconductor device package of claim 4, wherein the bond wires are configured to increase exposed wire area at the distal ends of the loop.

6. The semiconductor device package of claim 4, further comprising discrete conductive elements connected to the distal ends of the loop portions and protruding from the surface of the dielectric layer above the active surface.

7. The semiconductor device package of claim 3, further including at least one guide post comprising a dielectric material extending from the active surface and engaging a bond wire at a location intermediate the bond pad from which the bond wire extends and a peripheral edge of the semiconductor die.

8. The semiconductor device package of claim 3, further including at least one guide comb element comprising a dielectric material extending from the active surface at a location proximate a peripheral edge of the semiconductor die and engaging a bond wire.

9. The semiconductor device package of claim 3, further including at least one jumper pad at a location proximate a peripheral edge of the semiconductor die and having a bond wire affixed thereto.

10. The semiconductor device package of claim 3, further including at least one post comprising a dielectric material extending from the active surface, positioned at an intended outer lead bond (OLB) location over the active surface and engaging a portion of a bond wire.

11. The semiconductor device package of claim 10, further including at least one guide post comprising a dielectric material extending from the active surface and engaging a bond wire at a location intermediate the bond pad from which the bond wire extends and the at least one post positioned at the intended OLB location.

12. The semiconductor device package of claim 11, further including at least one guide comb element comprising a dielectric material extending from the active surface at a location proximate a peripheral edge of the semiconductor die and engaging a bond wire extending from the at least one post positioned at the intended OLB location.

13. The semiconductor device package of claim 11, further including at least one jumper pad at a location proximate a peripheral edge of the semiconductor die and having a bond wire extending from the at least one post positioned at the intended OLB location affixed thereto.

14. The semiconductor device package of claim 10, further comprising a discrete conductive element disposed on the at least one post positioned at the intended OLB location and in electrical contact with the portion of the bond wire engaged thereby.

15. The semiconductor device package of claim 1, wherein the conductors comprise electrically conductive traces.

16. The semiconductor device package of claim 15, wherein each conductive trace lies partially over a bond pad and extends toward the peripheral edge of the semiconductor die in either a trench formed in a layer of dielectric material disposed on the active surface or over an exposed surface of the layer of dielectric material, and further comprising another layer of dielectric material extending over the layer of dielectric material and the conductive traces.

17. The semiconductor device package of claim 15, wherein each conductive trace exhibits at least one of an increased depth and an increased width proximate a peripheral edge of the semiconductor die to which that conductive trace extends.

18. The semiconductor device package of claim 15, wherein each conductive trace has in contact therewith proximate a peripheral edge of the semiconductor die to which that trace extends, a portion of a conductive bump sectioned during singulation of the semiconductor die and providing increased conductive surface area for external electrical connection of that trace.

19. The semiconductor device package of claim 15, wherein at least some of the conductive traces each comprise an enlarged pad at an intended OLB location on the active surface intermediate the bond pad from which each of the at least some conductive traces extend and a peripheral edge of the semiconductor die, and further including a discrete conductive element in contact with each enlarged pad and projecting from a surface of the dielectric material above the active surface.

20. The semiconductor device package of claim 1, wherein each of the plurality of bond pads is disposed along a longitudinal axis of the at least one semiconductor die, and a conductor of the conductors extending from each bond pad extends toward a different peripheral edge than a conductor of the conductors extending toward a peripheral edge from at least one immediately adjacent bond pad.

21. A semiconductor device package, comprising:
a plurality of semiconductor die assemblies in a stack, each semiconductor die assembly of the plurality of semiconductor die assemblies comprising:
a semiconductor die having an active surface with a plurality of bond pads disposed thereon;
at least some bond pads of the plurality having conductors extending therefrom over the active surface to at least one peripheral edge of the semiconductor die; and
dielectric material surrounding the conductors, extending to the at least one peripheral edge of the die and having ends of the conductors exposed at a side surface thereof; and
interconnects comprising conductive paths extending between the exposed ends of the conductors of at least one semiconductor die assembly of the plurality of semiconductor die assemblies in the stack and at least another semiconductor die assembly of the plurality of semiconductor die assemblies in the stack.

22. The semiconductor device package of claim 21, wherein the at least one semiconductor die assembly of the plurality of semiconductor die assemblies further comprises a plurality of discrete conductive elements connected to at least some of the conductors thereof and projecting from a surface of the dielectric material above the active surface of the at least one semiconductor die assembly of the plurality of semiconductor die assemblies.

23. The semiconductor device package of claim 21, wherein the plurality of semiconductor die assemblies in the stack is oriented transversely to a plane of a carrier substrate having conductors, and wherein the exposed ends of the conductors at the side surface of the dielectric material of at least one of the plurality of semiconductor die assemblies are connected to at least some of the conductors of the carrier substrate.

24. The semiconductor device package of claim 23, wherein at least some of the exposed ends of the conductors at the side surface of the dielectric material of one semiconductor die assembly of the plurality of semiconductor die assemblies in the stack are aligned with at least some of the exposed ends of the conductors at the side surface of the dielectric material of at least another semiconductor die assembly of the plurality of semiconductor die assemblies in the stack, and further comprising interconnects comprising conductive paths extending between aligned exposed ends of the conductors of the at least one semiconductor die assembly of the plurality of semiconductor die assemblies and the at least another semiconductor die assembly of the plurality of semiconductor die assemblies.

25. The semiconductor device package of claim 23, wherein the carrier substrate is selected from the group consisting of a lead frame, a printed circuit board substrate, and an interposer substrate.

26. The semiconductor device package of claim 25, wherein the carrier substrate comprises a lead frame, and the conductors comprise leads.

27. The semiconductor device package of claim 25, wherein the carrier substrate comprises a printed circuit board substrate, and the conductors comprise conductive traces.

28. The semiconductor device package of claim 25, wherein the carrier substrate comprises an interposer substrate, the conductors comprise conductive traces, and the interposer substrate includes discrete conductive elements connected to the conductive traces for external connection of the package.

29. The semiconductor device package of claim 28, wherein the discrete conductive elements are selected from the group consisting of bumps, balls, studs, columns, pillars, pins and lands.

30. The semiconductor device package of claim 1, wherein:
the conductors comprise bond wires, the bond wires having loop portions with distal ends thereof exposed proximate a surface of the dielectric material at intended OLB locations above the active surface; and
the semiconductor device package further comprises discrete conductive elements disposed over and in contact with the distal ends and projecting from the surface of the dielectric material above the active surface.

31. The semiconductor device package of claim 30, wherein the dielectric material comprises a dielectric layer encapsulating the bond wires.

32. The semiconductor device package of claim 30, wherein the bond wires are configured to increase exposed wire area at the distal ends of the loop.

33. The semiconductor device package of claim 30, further including at least one guide post comprising a dielectric material extending from the active surface and engaging a bond wire at a location intermediate the bond pad from which the bond wire extends and a peripheral edge of the semiconductor die.

34. The semiconductor device package of claim 30, further including at least one guide comb element comprising a dielectric material extending from the active surface at a location proximate a peripheral edge of the semiconductor die and engaging a bond wire.

35. The semiconductor device package of claim 30, further including at least one jumper pad at a location proximate a peripheral edge of the semiconductor die and having a bond wire affixed thereto.

36. The semiconductor device package of claim 30, further including at least one post comprising a dielectric material extending from the active surface, positioned at an intended OLB location over the active surface and engaging a portion of a bond wire.

37. The semiconductor device package of claim 36, further including at least one guide post comprising a dielectric material extending from the active surface and engaging a bond wire at a location intermediate the bond pad from which the bond wire extends and the at least one post positioned at the intended OLB location.

38. The semiconductor device package of claim 36, further including at least one guide comb element comprising a dielectric material extending from the active surface at a location proximate a peripheral edge of the semiconductor die and engaging a bond wire extending from the at least one post positioned at the intended OLB location.

39. The semiconductor device package of claim 36, further including at least one jumper pad at a location proximate a peripheral edge of the semiconductor die and having a bond wire extending from the at least one post positioned at the intended OLB location affixed thereto.

40. The semiconductor device package of claim 30, wherein the intended OLB locations comprise a two-dimensional array over the active surface.

41. The semiconductor device package of claim 21, wherein the exposed ends of the conductors of at least one semiconductor die assembly of the plurality of semiconductor die assemblies in the stack are vertically aligned with the exposed ends of the conductors of at least another semiconductor die assembly of the plurality of semiconductor die assemblies in the stack.

* * * * *